United States Patent
Lu et al.

(10) Patent No.: US 9,275,900 B2
(45) Date of Patent: *Mar. 1, 2016

(54) METHOD OF FABRICATING A SEMICONDUCTOR INTERCONNECT STRUCTURE

(71) Applicant: Taiwan Semiconductor Manufacturing Company, Ltd., Hsin-Chu (TW)

(72) Inventors: Chih Wei Lu, Hsin-Chu (TW); Chung-Ju Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/446,063

(22) Filed: Jul. 29, 2014

(65) Prior Publication Data

US 2014/0335689 A1 Nov. 13, 2014

Related U.S. Application Data

(63) Continuation of application No. 13/901,340, filed on May 23, 2013, now Pat. No. 8,802,560.

(60) Provisional application No. 61/783,944, filed on Mar. 14, 2013.

(51) Int. Cl.
| | |
|---|---|
| *H01L 21/00* | (2006.01) |
| *H01L 21/768* | (2006.01) |
| *H01L 21/321* | (2006.01) |
| *H01L 21/3213* | (2006.01) |
| *H01L 21/311* | (2006.01) |

(52) U.S. Cl.
CPC ........ *H01L 21/76877* (2013.01); *H01L 21/321* (2013.01); *H01L 21/32136* (2013.01); *H01L 21/7684* (2013.01); *H01L 21/76802* (2013.01); *H01L 21/76819* (2013.01); *H01L 21/76883* (2013.01); *H01L 21/76885* (2013.01); *H01L 21/31144* (2013.01); *H01L 21/32139* (2013.01)

(58) Field of Classification Search
CPC ............ H01L 21/31144; H01L 21/321; H01L 21/7684; H01L 21/76883; H01L 21/76877; H01L 21/76802; H01L 21/76885; H01L 21/32136; H01L 21/32139
See application file for complete search history.

(56) References Cited

U.S. PATENT DOCUMENTS

| | | |
|---|---|---|
| 5,686,760 A | 11/1997 | Miyakawa |
| 7,312,151 B2 | 12/2007 | Frank et al. |
| 7,351,656 B2 | 4/2008 | Sakata et al. |
| 8,802,560 B1 * | 8/2014 | Lu et al. .......... 438/631 |

* cited by examiner

*Primary Examiner* — Richard Booth
(74) *Attorney, Agent, or Firm* — Slater & Matsil, L.L.P.

(57) ABSTRACT

A method for forming a semiconductor interconnect structure includes forming a dielectric layer on a substrate and patterning the dielectric layer to form an opening therein. A metal layer fills the opening and covers the dielectric layer. The metal layer is planarized so that it is co-planar with a top of the dielectric layer. A treating process is performed on the metal layer to convert a top surface thereof into a metal oxide layer. A copper-containing layer is then formed over the metal oxide layer and the dielectric layer. The copper-containing layer is etched to form interconnect features, wherein the etching stops at the metal oxide layer and does not etch into the underlying metal layer. A radiation exposure process is thereafter performed on the metal oxide layer to convert it into a non-oxidized metal layer.

20 Claims, 6 Drawing Sheets

METHOD OF FABRICATING A SEMICONDUCTOR INTERCONNECT STRUCTURE

RELATED CASES

This application is a continuation of U.S. patent application Ser. No. 13/901,340, filed May 23, 2013, and entitled, "Method of Fabricating a Semiconductor Interconnect Structure," which application claims priority to U.S. Provisional Patent Application No. 61/783,944, filed Mar. 14, 2013, entitled "Conductive Structure Recess Free Process and Structure Formed Thereby," both of which applications are incorporated herein by reference.

BACKGROUND

Since the mid-1990's so-called damascene processes have been the dominant technology for forming conductive interconnects in integrated circuits. Those skilled in the art recognize that damascene processing involves forming openings (via and trenches) in a dielectric layer and then filling the openings with a conductive, typically copper. The copper is typically deposited by initially depositing a thin seed layer within the openings and then filling the openings by electroplating copper.

FIG. 1 is a cross-sectional view of an interconnect formed on a semiconductor device from the prior art. In the figure, a patterned dielectric layer 54 is formed on a substrate 50. Formed between an opening of the patterned dielectric layer 54 and thereabove is a conductive layer 58. Formed between the dielectric layer 54 and the conductive layer 58 is a hard mask 56. A mask layer, such as a tri-layer photoresist layer 60 is formed above the conductive layer 58. In a later process, using the tri-layer photoresist layer 60 as a mask, the conductive layer 58 will be etched to form conductive lines 58 above the dielectric layer 54, as shown in FIG. 2.

The conventional copper metal line formation method can have a number of problems. One problem may be misalignment. In the process of device feature or pattern exposure, the alignment between successive layers that are being created is of critical importance. Smaller device dimensions place even more stringent requirements on the accuracy of the alignment of the successive layers that are superimposed on each other. In FIG. 2, following the etching of the conductive layer 58 in which the photoresist layer 60 is used as a mask to form conductive lines 58, via recesses VR may be formed at the juncture of a conductive line 58 and the hard mask 56 and/or the dielectric layer 54. Via recesses can be caused when the photoresist layer is misaligned (e.g., shifted to one side). Such misalignment can result from a mask misalignment failure, for example, during the photolithography process. Due to this misalignment, the via recess formed can be a serious problem in the conventional copper etch approach by causing unstable yield and decreased reliability.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Embodiments will be described with respect to a specific context, namely an interconnect structure for an integrated circuit. Other embodiments may also be applied, however, to other semiconductor devices and features. For instance, the present teachings could be applied to structures other than an integrated circuit, such as an interposer device, a printed circuit board, a package substrate, and the like.

Figure 1:
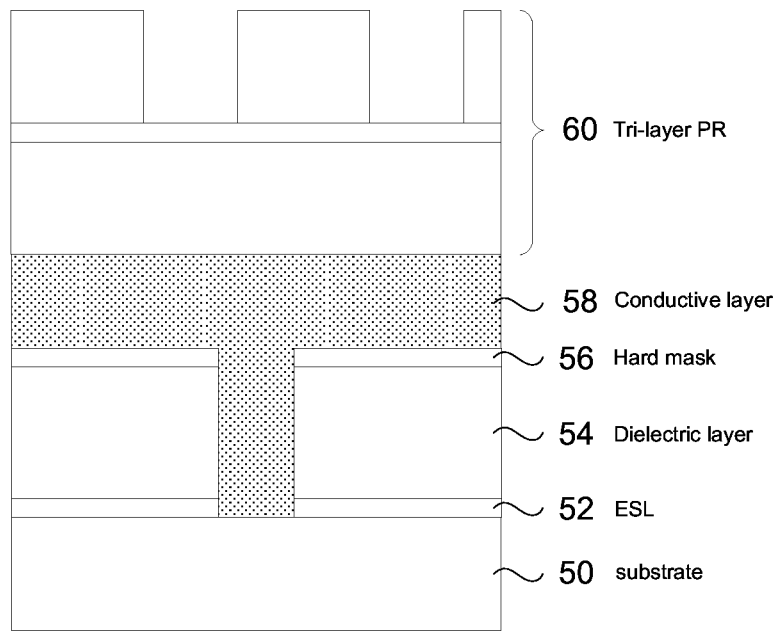
FIGS. 1 and 2 are cross-sectional views of a part of an interconnect structure of a semiconductor device from the prior art.
Figure 2:
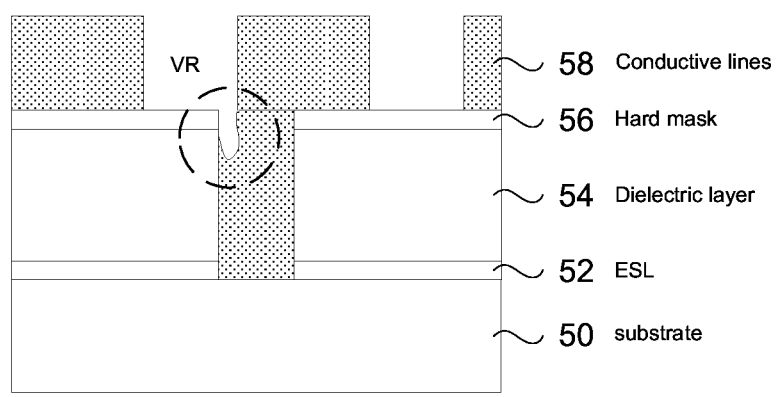
Figure 3:
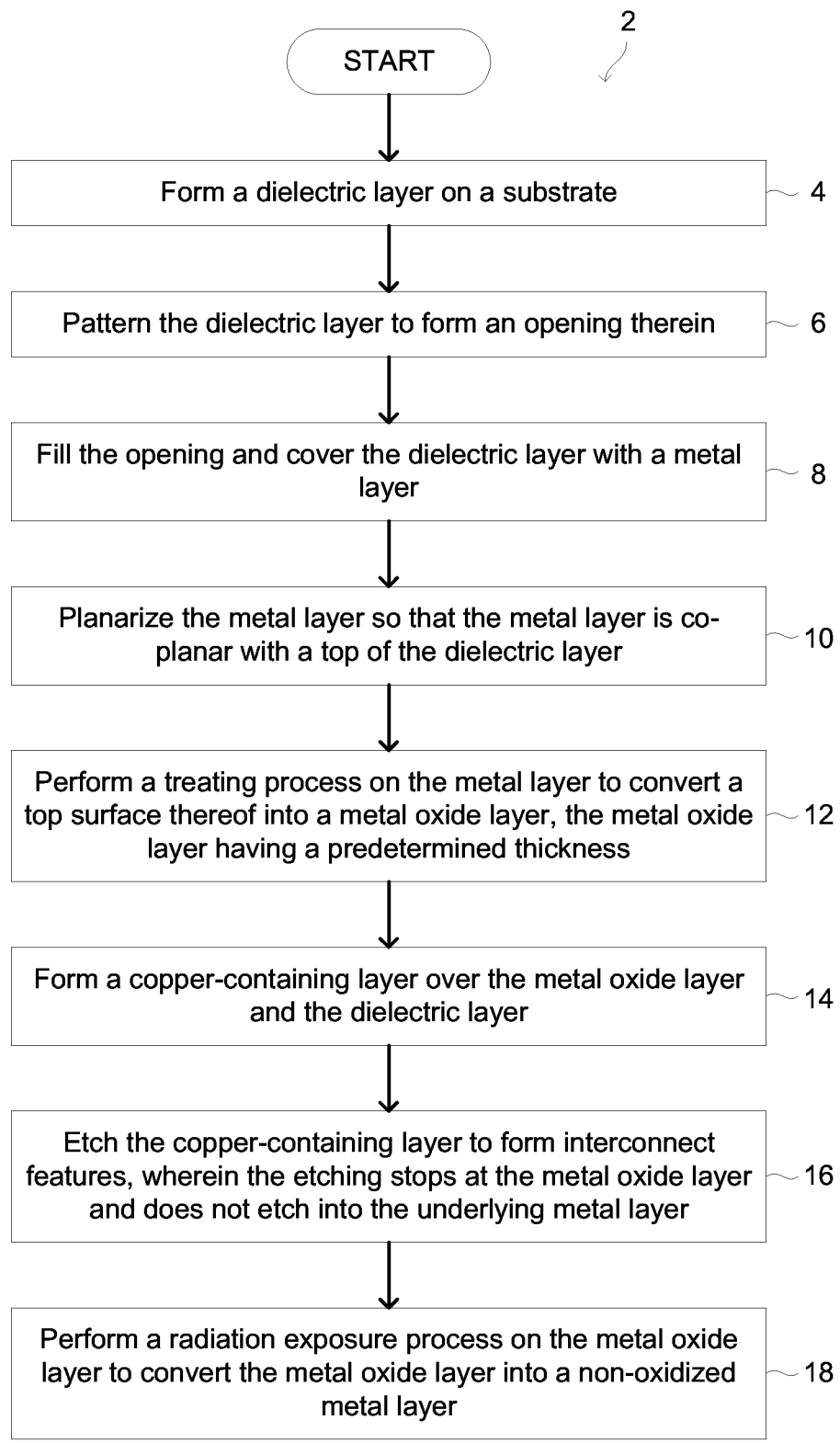
FIG. 3 is a flowchart of a method of fabricating an interconnect structure of a semiconductor device according to various embodiments of the present disclosure.

With reference now to FIG. 3, there is shown a flowchart of a method 2 for fabricating an interconnect structure of a semiconductor device according to various aspects of the present disclosure. Referring to FIG. 3, the method 2 includes block 4, in which a dielectric layer is formed on a substrate. The method 2 includes block 6, in which the dielectric layer is patterned to form an opening therein. The method 2 includes block 8, in which the opening is filled and the dielectric layer is covered with a metal layer. The method 2 includes block 10, in which the metal layer is planarized so that the metal layer is co-planar with a top of the dielectric layer. The method 2 includes block 12, in which a treating process is performed on the metal layer to convert a top surface thereof into a metal oxide layer, the metal oxide layer having a predetermined thickness. The method 2 includes block 14, in which a copper-containing layer is formed over the metal oxide layer and the dielectric layer. The method 2 includes block 16, in which the copper-containing layer is etched to form interconnect features. The etching stops at the metal oxide layer and does not etch into the underlying metal layer. The method 2 further includes block 18, in which a radiation exposure process is performed on the metal oxide layer to convert the metal oxide layer into a non-oxidized metal layer.

It is understood that additional processes may be performed before, during, or after the blocks 4-18 shown in FIG. 3 to complete the fabrication of the semiconductor device, but these additional processes are not discussed herein in detail for the sake of simplicity.

FIGS. 4-12 are diagrammatic fragmentary cross-sectional side views of a portion of a wafer at various fabrication stages according to embodiments of the method 2 of FIG. 3. It is understood that FIGS. 4-12 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 4:
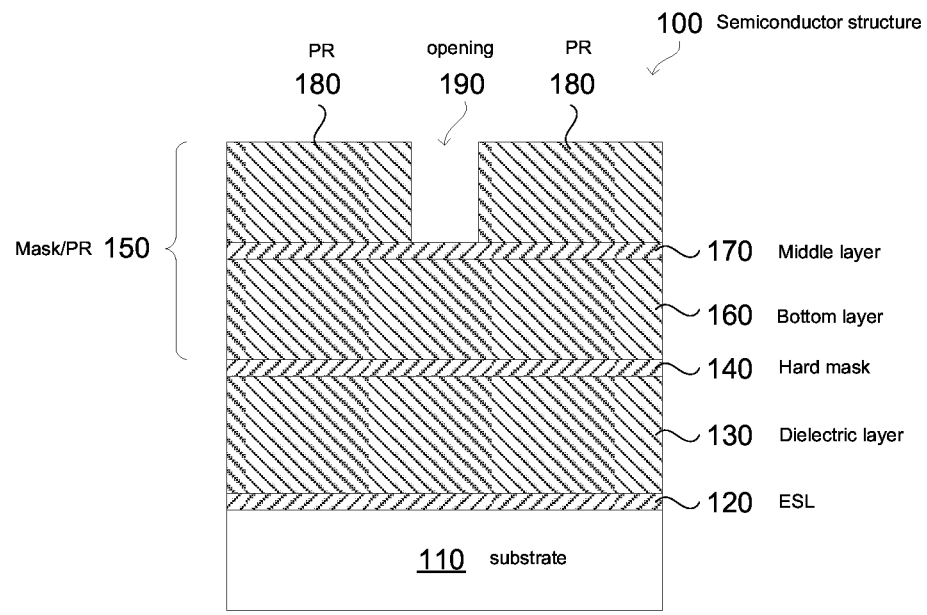
FIGS. 4-12 are diagrammatic fragmentary cross-sectional side views of a portion of a wafer at various stages of fabrication in accordance with various embodiments of the present disclosure.

With reference now to FIG. 4, there is shown an illustrative semiconductor structure 100 shown in highly simplified cross-sectional views. Various features not necessary for understanding of the invention have been omitted for sake of clarity and brevity. Semiconductor structure 100 includes a substrate 110 upon which has been formed an etch stop layer 120. Substrate 110 refers generally to any structures or materials underlying etch stop layer 120. In some applications, substrate 110 includes a semiconductor wafer such as a bulk silicon wafer or a silicon (or other semiconductor material) layer formed atop a bulk wafer and separated therefrom by, e.g., a buried oxide layer in a so-called silicon on insulator (SOI) arrangement. One or more active or passive devices, such as transistors or capacitors, could be formed in substrate 110. In another application, substrate 110 could be an underlying metal (or other conductor) layer in a multi-metal interconnect scheme. For instance, substrate 110 could be an underlying metal layer (or several stacked metal layers) manufactured according to the steps illustrated in FIGS. 4-12.

A dielectric layer 130, preferably a low-k dielectric layer 130 is formed on the etch stop layer 120. Low k generally refers to a dielectric layer having a dielectric constant of less than about 3.5. Materials such as porous silicon oxide, doped silicon oxide, silicon carbide, silicon oxynitride, and the like could be employed for dielectric layer 130, although these are examples only and are not intended to be exhaustive or limiting. The dielectric layer 130 may be formed on the etch stop layer 120 by a process such as, for example vapor deposition, plasma-enhanced chemical vapor deposition, spin on coating, or other like processes.

Hard mask 140 is formed atop dielectric layer 130. In a case where dielectric layer 130 is an oxide, hard mask 140 could be, for example, silicon nitride or another material that has a high degree of resistance to etchants typically employed to etch oxides. Other materials, such as SiCN, SiOC, and the like could also be employed for hard mask 140.

Mask 150 is formed atop hard mask 140. In the illustrated embodiment, mask 150 is a tri-layer mask comprising three separate layers. While a conventional mask layer, such as a single polymer photoresist layer, could be employed, a tri-layer mask 150 allows for the formation of finer features having smaller dimensions and pitch. In the illustrated embodiment, bottom layer 160 of tri-layer mask 150 is a carbon organic layer, similar to a conventional photoresist layer. Middle layer 170 is a silicon containing carbon film, employed to help pattern bottom layer 160. Top layer 180 is a photoresist material, such as for instance, a photoresist material designed for exposure to 193 nm wavelengths, and preferably designed for immersion photolithography, for instance.

Figure 5:
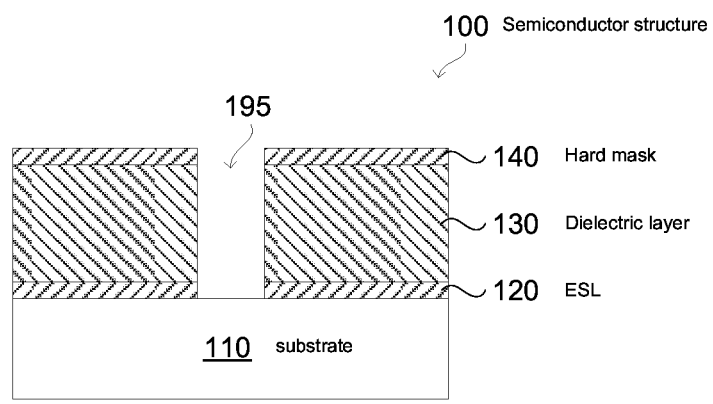

As shown in FIG. 4, an opening 190 is formed in mask 150, using known lithography techniques, such as for instance, immersion photolithography. This opening will be transferred to all layers of mask 150, through hard mask 140 and then to dielectric layer 130 and etch stop layer 120, resulting in an opening 195, sometimes referred to herein as a via opening, being formed in dielectric layer 130 and etch stop layer 120, as shown in FIG. 5. Note that opening 195 exposes an underlying portion of substrate 110 which, as described above, could be an underlying conductive interconnect, a transistor contact, or the like. Mask 150 is removed using known ashing and/or etching techniques, the details of which are omitted herein.

Figure 6:
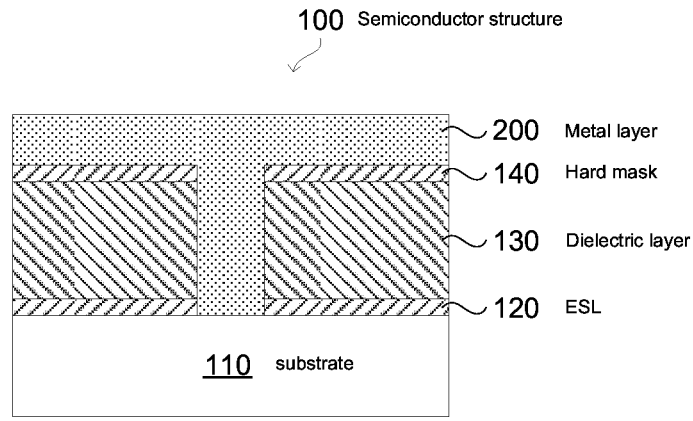

Turning now to FIG. 6, a metal layer 200 is deposited over semiconductor structure 100. In illustrated embodiments, a material of the metal layer 200 is a copper alloy. Examples of a suitable copper alloy include CuMn, CuCr, CuV, CuNb, and CuTi. The copper alloy may be in the range of from about 90% copper to about 99.8% copper. Other suitable alloys and percentages will be apparent to those skilled in the art upon undertaking routine experimentation once informed by the present disclosure. By using a copper alloy material, it is possible to manufacture copper interconnects without the need to form barrier lines, such as Ta, TaN, and the like, that are commonly employed in conventional damascene processes. That being said, it is within the contemplated scope of the present invention that a barrier liner could be employed in some applications.

In one embodiment, metal layer 200 is formed by a plasma vapor deposition (PVD) that completely fills opening 195 and forms a blanket coating over a top surface of dielectric layer 130, or more accurately over the top surface of hard mask 140 overlying dielectric layer 130. In some embodiments, hard mask 140 may be omitted, in which case metal layer 200 would be formed on dielectric layer 130. Metal layer 200 may be formed to a thickness above dielectric layer 130 of from about 500 A to about 2 um, depending upon the desired application and the technology node employed.

In another embodiment, metal layer 200 is formed by first depositing a seed layer by, e.g., physical vapor deposition techniques. The seed layer could be formed to a thickness of perhaps about 20 A to about 100 A, although other thicknesses could be employed depending upon the application and the desired process. Then a copper alloy material is formed on the seed layer using, e.g., an electro-plating or electro-less plating technique. The metal layer 200 maybe deposited by still other processes, such as CVD, ALD, sputtering, and spin-on coating.

Figure 7:
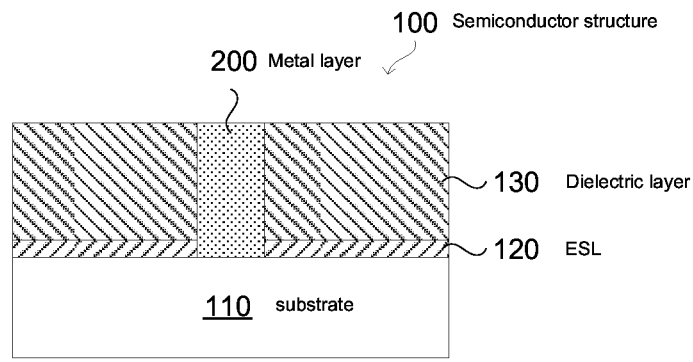
Figure 8:
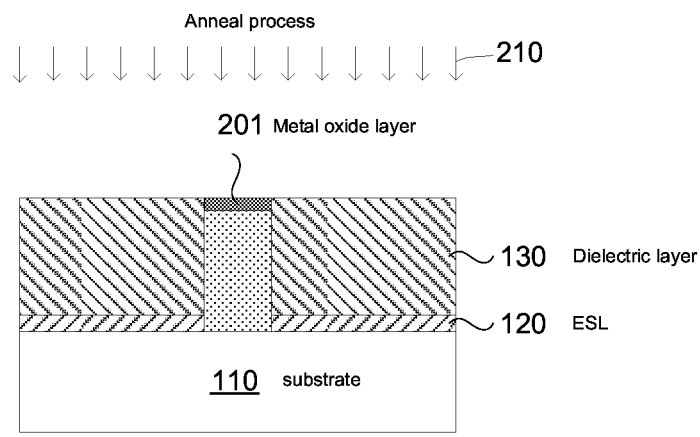

The metal layer 200 and, in some embodiments the hard mask layer 140 are planarized by a chemical mechanical polishing (CMP) or an etch back step, for example so that a top of the metal layer 200 is substantially co-planar with a top surface of the dielectric layer 130, as illustrated in FIG. 7. As shown in FIG. 8, in an aspect of the present disclosure, a treatment process such as an anneal, plasma or heat process 210 is applied to the semiconductor structure 100 to convert a top surface of the metal layer 200 into a metal oxide layer 201. The anneal process 210 may be a rapid thermal anneal (RTA), a laser anneal, and/or a flash lamp anneal. The anneal process may be conducted in an oxygen ambient, a carbon dioxide ambient, or a combination of steam ambient and oxygen ambient combined. The annealing may be performed in a single wafer rapid thermal annealing (RTP) system or a batch type furnace system or the anneal procedure can be performed in situ in the same tool. In an exemplary embodiment, the anneal process 210 is performed in an oxygen or a carbon dioxide atmosphere and the semiconductor substrate 100 is annealed at a temperature range from about 25 C to about 400 C for a time from about 1 second to about 600 seconds. As a result of the semiconductor substrate 100 being annealed in an oxygen atmosphere, a top surface of the metal layer 200 is converted into the metal oxide layer 201. In one embodiment, the metal oxide layer 201 is a copper oxide layer, although other metal oxides may be produced depending upon the desired application and the technology node employed. In one embodiment, the metal oxide layer 201 has a thickness of from about 10 Angstroms to about 200 Angstroms, although other oxide layer thicknesses can be achieved depending on the tailoring of the anneal process 210. In some embodiments, the metal oxide layer 201 is substantially non-conductive.

Figure 9:
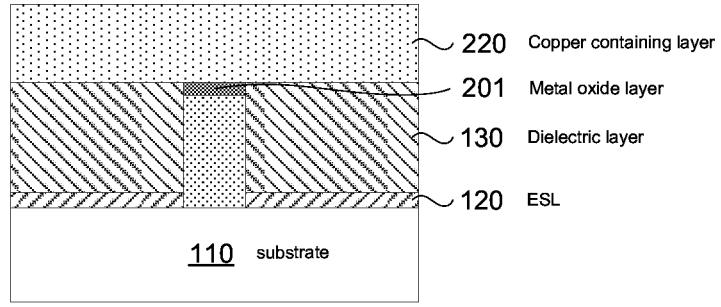

Referring now to FIG. 9, a copper containing layer 220 is deposited over the metal oxide layer 201 and the dielectric layer 130. The copper containing layer 220 may be deposited by plasma vapor deposition (PVD), for example. In some embodiments, the copper containing layer 220 is thereafter thinned down (e.g., via chemical mechanical polish, CMP, by etch back, or the like). Although not shown in FIG. 9, in some embodiments a barrier layer may be formed on the dielectric layer 130 and the metal oxide layer 201 prior to forming the copper containing layer 220 over the dielectric layer 130 and the metal oxide layer 201.

Also not shown in FIG. 9, an etch stop layer may be formed on the planarized copper containing layer 220. In one embodiment, the etch stop layer is formed of silicon nitride, silicon carbon nitride, or another material that provides sufficient etch selectivity relative to the copper containing layer 220.

Figure 10:
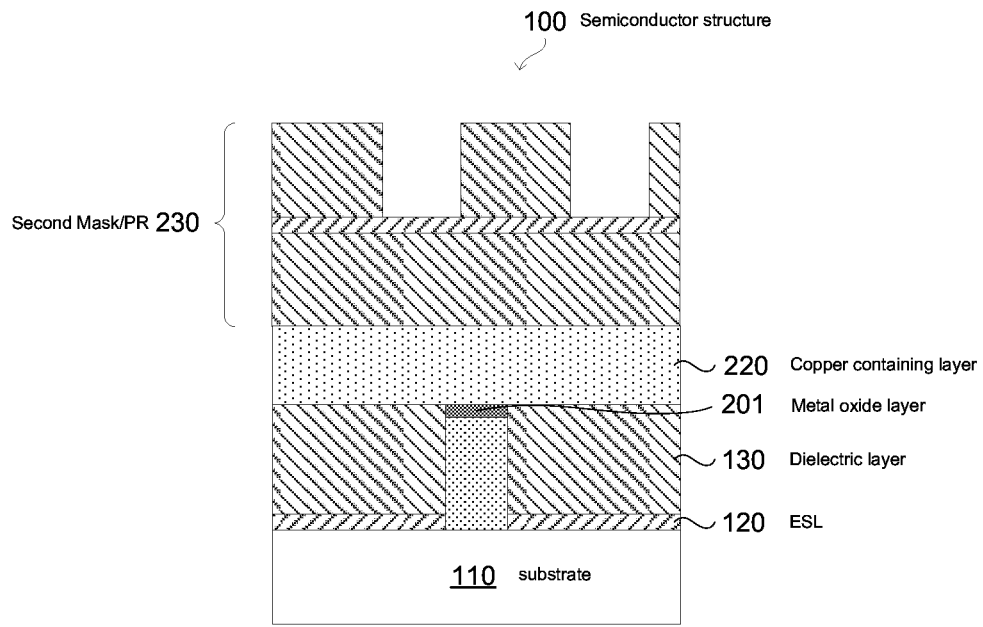
Figure 11:
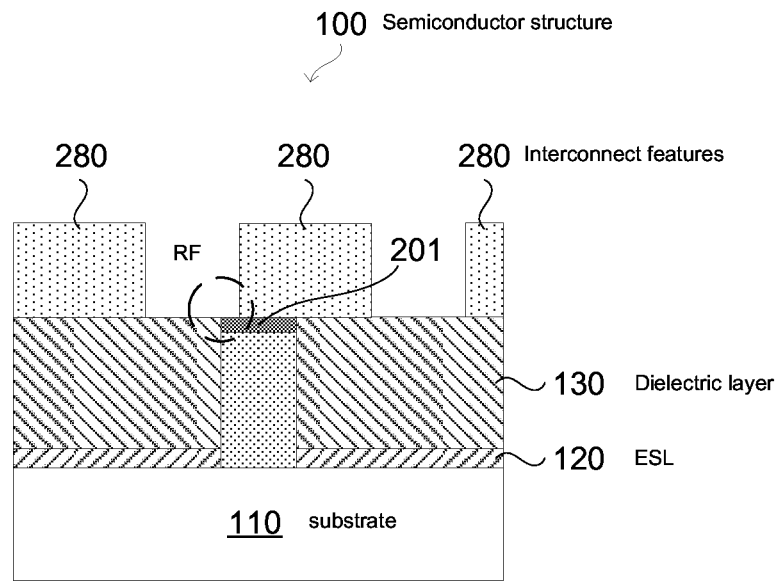

Turning now to FIG. 10, a second mask 230 is formed. In the illustrated example, mask 230 is a tri-layer mask similar to mask 150 illustrated in FIG. 4. As with the previously described steps, it is not necessary to use a tri-layer mask, unless the particular application and feature size calls for such an approach. Regardless of the type of mask employed, a pattern is formed in mask 230 as shown in FIG. 10. Next, as shown in FIG. 11, the pattern is transferred to copper containing layer 220 using known lithography techniques. Copper containing layer 220 is preferably etched anisotropically to form nearly vertical sidewalls. In some embodiments, a chlorine plasma etch is employed to pattern copper containing layer 220. Other plasma etches, including reactive ion etching (RIE), could also be employed.

The result of the etching step is that the copper containing layer 220 is patterned into interconnect features or interconnects 280. These interconnect features 280 run across the major surface of semiconductor structure 100 and may be metal lines, metal vias, or via features to provide vertical electrical routing between metal lines. The etching stops at the metal oxide layer 201 and does not etch thereunder, thus avoiding undesirable recesses that may be formed in the prior art method and resulting in a recess free (RF) semiconductor structure 100. The faster etching rate of the copper containing layer 220 is desirable because it eliminates or reduces the amount of undercutting that will occur in the metal oxide layer 201. As can be seen from FIG. 11, there is little or no undercutting of the metal oxide layer 201.

Figure 12:
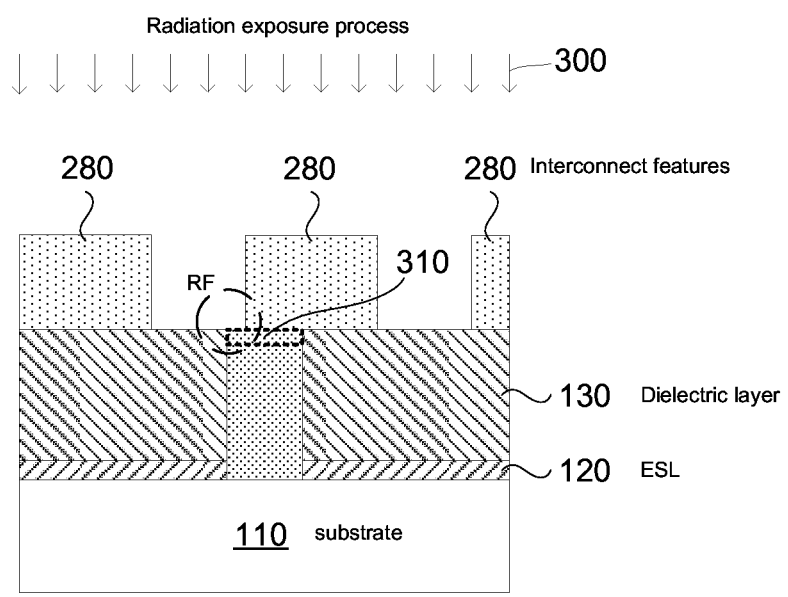

Referring now to FIG. 12, a radiation exposure process 300 performed by a lithography exposing tool is applied to the semiconductor structure 100 to convert the metal oxide layer 201 substantially into a non-oxidized metal layer 310. The exposing tool may utilize a deep ultraviolet (DUV), extreme ultraviolet (EUV), or X-ray radiation. In an exemplary embodiment where X-ray radiation is used, the X-ray exposure process is performed in an inert, reduction or oxygen-free atmosphere, at an X-ray wavelength from about 10-9 to about 10-12 m, at an energy from about 1 eV to about 10 GeV, at a temperature range from about 25 C to about 400 C, and for a time from about 1 second to about 600 seconds. When the radiation exposure process 300 projects onto the metal oxide layer 201, it induces CuO, $Cu_2O$, $Mn_2O_3$, $Mn_3O_4$, $MnO_2$, $Cr_2O_3$, $V_2O_3$, or $TiO_2$, and results in converting the oxidized metal layer 201 substantially into the non-oxidized metal layer 310. In one embodiment, the non-oxidized metal layer 310 is substantially conductive in order for the metal layer 200 to be conductive to other conductive layers therearound.

Further processing steps could include depositing a dielectric layer in the openings between the interconnect features 280 and planarizing the dielectric layer. The above described process steps may be repeated for the formation of additional vertical and horizontal interconnect features.

Although the present embodiments and their advantages have been described in detail, it should be understood that various changes, substitutions, and alterations can be made herein without departing from the scope of the disclosure as defined by the appended claims.

The present disclosure has described various exemplary embodiments. According to one embodiment, a method for forming a semiconductor interconnect structure includes forming a dielectric layer on a substrate and patterning the dielectric layer to form an opening therein. A metal layer fills the opening and covers the dielectric layer. The metal layer is planarized so that it is co-planar with a top of the dielectric layer. A treating process is performed on the metal layer to convert a top surface thereof into a metal oxide layer. A copper-containing layer is then formed over the metal oxide layer and the dielectric layer. The copper-containing layer is etched to form interconnect features, wherein the etching stops at the metal oxide layer and does not etch into the underlying metal layer. A radiation exposure process is thereafter performed on the metal oxide layer to convert it into a non-oxidized metal layer.

According to another embodiment, a method for forming an integrated circuit interconnect structure includes forming a via opening in a dielectric layer on a substrate. A copper alloy layer fills the via opening and covers the dielectric layer. The copper alloy layer is planarized so that the copper alloy layer is co-planar with a top of the dielectric layer. The copper alloy layer is annealed to convert a top surface thereof into a copper alloy oxide layer. A copper-containing layer is formed over the copper alloy oxide layer and the dielectric layer. The copper-containing layer is etched to form interconnect features, wherein the etching stops substantially at the copper alloy oxide layer and does not etch into the underlying copper alloy layer. A radiation treatment is performed on the copper alloy oxide layer to convert the copper alloy oxide layer into a non-oxidized copper alloy layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method for forming a semiconductor interconnect structure, comprising:
    forming a patterned metal layer on a substrate;
    performing a treating process on the metal layer to convert a top surface thereof into a metal oxide layer, the metal oxide layer having a predetermined thickness;
    forming a metal-containing layer over the metal oxide layer;
    etching the metal-containing layer to form interconnect features; and
    performing a radiation exposure process on the metal oxide layer to convert the metal oxide layer into a non-oxidized metal layer.

2. The method of claim 1, wherein the step of forming a patterned metal layer on a substrate comprises:
    forming a dielectric layer on the substrate;
    forming a hard mask layer on the dielectric layer;

forming a tri-layer mask layer on the hard mask layer;
patterning the tri-layer mask layer to form an opening therein;
forming an opening in the hard mask layer using the opening in the tri-layer mask layer as a pattern;
forming an opening in the dielectric layer using the opening in the hard mask layer as a pattern;
filling the opening in the dielectric layer with the metal layer; and
patterning the metal layer.

3. The method of claim 1, wherein the patterned metal layer is a copper alloy.

4. The method of claim 1, wherein the patterned metal layer is a material selected from the group consisting of CuMn, CuCr, CuV, CuNb, CuTi, and combinations thereof.

5. The method of claim 1, wherein the metal-containing layer is a copper alloy.

6. The method of claim 1, wherein the step of performing a treating process includes a process selected from the group consisting of a plasma process, an anneal process, a heat process, a rapid thermal anneal process, a laser anneal, a flash lamp anneal, and combinations thereof.

7. The method of claim 1, wherein the step of performing a treating process includes performing the treating process in an oxygen atmosphere.

8. The method of claim 1, wherein the step of performing a radiation exposure process includes exposing the metal oxide layer to radiation selected from the group consisting of deep ultraviolet, extreme ultraviolet, X-ray, and combinations thereof.

9. A method for forming a semiconductor interconnect structure, comprising:
forming a dielectric layer on a substrate;
patterning the dielectric layer to form an opening in the dielectric layer;
filling the opening and covering the dielectric layer with a conductive layer;
planarizing the conductive layer so that the conductive layer is co-planar with a top of the dielectric layer;
performing a treating process on the conductive layer to convert a top surface thereof into a non-conductive sub-layer;
forming a second conductive layer on the non-conductive sub-layer and the dielectric layer;
etching the second conductive layer to form interconnect features; and
performing a radiation exposure process on the non-conductive sub-layer to convert the non-conductive sub-layer into a conductive sub-layer.

10. The method of claim 9, wherein the conductive layer is a copper alloy and wherein the non-conductive sub-layer is copper oxide.

11. The method of claim 9, wherein the second conductive layer and the conductive layer comprise the same material.

12. The method of claim 9, wherein the step of patterning the dielectric layer includes:
forming a hard mask over the dielectric layer;
forming a tri-layer mask over the hard mask;
patterning the tri-layer mask;
patterning the hard mask using the patterned tri-layer mask as a pattern; and
patterning the dielectric layer using the patterned hard mask as a pattern.

13. The method of claim 12, wherein the tri-layer mask includes a bottom layer comprising a carbon organic layer, a middle layer comprising a silicon containing carbon film, and a top layer comprising a photoresist material.

14. The method of claim 9, wherein the step of performing a treating process on the conductive layer to convert a top surface thereof into a non-conductive sub-layer includes exposing the structure to a process selected from the group consisting of a plasma process and a heat process, and combinations thereof, in an atmosphere selected from the group consisting of an oxygen atmosphere, a carbon dioxide atmosphere, a combined steam and oxygen ambient, and combinations thereof.

15. The method of claim 9, wherein the step of etching the second conductive layer to form interconnect features includes exposing the structure to a chlorine plasma.

16. A method for forming a semiconductor interconnect structure, comprising:
forming a patterned copper alloy layer on a substrate;
converting a top surface of the a patterned copper alloy layer into a metal oxide layer;
forming a copper-containing layer over the metal oxide layer;
patterning the copper-containing layer; and
converting the metal oxide layer back into a copper alloy layer after patterning the copper-containing layer.

17. The method of claim 16, wherein the step of converting a top surface of the a patterned copper alloy layer into a metal oxide layer includes performing an anneal process on the patterned copper alloy layer in an atmosphere selected from the group consisting of oxygen ambient, carbon dioxide ambient, combination steam ambient and oxygen ambient, and combinations thereof.

18. The method of claim 16, wherein the step of converting a top surface of the a patterned copper alloy layer into a metal oxide layer results in a metal oxide layer having a thickness of from about 10 Å to about 200 Å.

19. The method of claim 16, wherein the step of patterning the copper-containing layer includes exposing the structure to an etchant that etches copper without undercutting the metal oxide layer.

20. The method of claim 19, wherein the etchant includes chlorine.

* * * * *